United States Patent
Fournel et al.

(10) Patent No.: US 7,184,299 B2
(45) Date of Patent: Feb. 27, 2007

(54) NONVOLATILE SRAM MEMORY CELL

(75) Inventors: Richard Fournel, Lumbin (FR);
Emmanuel Vincent, Grenoble (FR);
Sylvie Bruyere, Grenoble (FR);
Philippe Candelier, Saint Mury (FR);
Francois Jacquet, Froges (FR)

(73) Assignee: STMicroelectronics S.A., Montrouge (FR)

( * ) Notice: Subject to any disclaimer, the term of this patent is extended or adjusted under 35 U.S.C. 154(b) by 5 days.

(21) Appl. No.: 10/726,263

(22) Filed: Dec. 2, 2003

(65) Prior Publication Data
US 2004/0252554 A1  Dec. 16, 2004

(30) Foreign Application Priority Data
Dec. 23, 2002  (FR) .................................. 02 16558

(51) Int. Cl.
*G11C 11/00* (2006.01)
(52) U.S. Cl. ...................................... 365/156; 365/188
(58) Field of Classification Search ................ 365/156, 365/188
See application file for complete search history.

(56) References Cited

U.S. PATENT DOCUMENTS

| 4,207,615 | A | | 6/1980 | Mar |
| 5,757,696 | A | | 5/1998 | Matsuo et al. |
| 5,892,712 | A | * | 4/1999 | Hirose et al. .......... 365/185.07 |
| 6,122,191 | A | * | 9/2000 | Hirose et al. .......... 365/185.01 |
| 6,331,947 | B1 | | 12/2001 | Widdershoven et al. |
| 2003/0179630 | A1 | * | 9/2003 | Choi ......................... 365/200 |
| 2004/0252554 | A1 | | 12/2004 | Fournel et al. |

OTHER PUBLICATIONS

International Search Report, FR 02 16558, dated Aug. 7, 2003.

* cited by examiner

*Primary Examiner*—Tuan T. Nguyen
(74) *Attorney, Agent, or Firm*—Jenkens & Gilchrist, PC

(57) ABSTRACT

An SRAM memory cell includes first and second inverters (14, 16) interconnected between first and second data nodes. Each inverter is formed from complementary MOS transistors (18, 20, 18', 20') connected in series between a DC voltage supply source and a grounding circuit (22). A circuit (28, 30) programs the MOS transistors by causing an irreversible degradation of a gate oxide layer of at least some of the transistors (18, 18').

20 Claims, 2 Drawing Sheets

US 7,184,299 B2

NONVOLATILE SRAM MEMORY CELL

PRIORITY CLAIM

The present application claims priority from French Application for Patent No. 02 16558 filed Dec. 23, 2002, the disclosure of which is hereby incorporated by reference.

BACKGROUND OF THE INVENTION

1. Technical Field of the Invention

The present invention relates to static random access memories (SRAM) embodied in MOS technology.

2. Description of Related Art

As is known, a conventional SRAM memory cell comprises six MOS transistors arranged in such a way as to form first and second inverters interconnected between first and second data nodes.

Each inverter comprises a PMOS load transistor connected in series with an NMOS inverter transistor between a DC voltage supply source (DC reference) and a ground reference. The gates of the PMOS and NMOS transistors of each inverter are joined. The common electrodes shared by the NMOS and PMOS transistors constitute a data node.

Two NMOS select transistors provide for the interconnection of the cell with a word line and a bit line, and thus allow reading of the memory point or modification of the latter.

Such cells are advantageous in so far as they are relatively fast. Specifically, the cycle time, that is to say the minimum time between two successive operations of the memory, be it while reading or writing, corresponds to the memory access time, that is to say the time between the moment at which the address is present and the moment at which the item of data read is available at the output of the memory.

However, with this type of memory, the memory is permanent as long as the circuits are powered. Stated otherwise, the data are lost when the memory is no longer powered.

It is therefore necessary to couple these memories to additional nonvolatile memories to which the data are transferred before the power supply is cut off.

In view of the foregoing, there is a need for a nonvolatile SRAM memory cell, that is to say one which is capable of permanently retaining its content.

SUMMARY OF THE INVENTION

An SRAM memory cell comprising first and second inverters interconnected between first and second data nodes, wherein each inverter includes complementary MOS transistors connected in series between a DC reference and a ground reference.

This cell comprises, according to a general characteristic, means for programming the MOS transistors adapted for causing, after programming, an irreversible degradation of a gate oxide layer of at least some of the transistors.

It has thus been noted that such a degradation brings about a modification of the characteristics of the transistors, engendering a drop in the drain current of possibly up to around 30%. Such a degradation is then used for the storage of information, for a duration of retention of possibly up to some ten years.

According to another characteristic of this cell, each inverter comprises a first PMOS transistor and a second NMOS transistor coupled in series between the DC reference and the ground reference, the data nodes being formed respectively between the two NMOS and PMOS transistors of the inverters.

According to yet another characteristic of the SRAM memory cell of the invention, the degraded MOS transistor is a thin gate oxide layer transistor, also known as a GO1 transistor.

After programming, the oxide layer is degraded at least locally in such a way as to obtain, during the reading of the cell, a variation in the current delivered by the transistor.

According to one embodiment, the programming means comprise, for each inverter, a programming transistor linked between a programming control line and the transistors of the inverter.

These programming means thus, for example, comprise an NMOS transistor ensuring the selective linking of the gate of a transistor to be degraded to a programming voltage source delivering a voltage level able to cause, jointly with the DC reference linked to the drain of the said transistor, a degradation in the gate oxide layer of the transistor, the programming transistor being driven by the programming control line.

Furthermore, according to another characteristic, this cell comprises means for causing the cell to operate as an SRAM memory after programming.

These means may be embodied in the form of NMOS transistors providing for the interconnection of the inverters, these transistors being linked to a control line for instructing the cell to operate as an SRAM memory.

The drain electrode and source electrode of each of these NMOS transistors are respectively linked to the gate of the transistors of one of the inverters.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

Figure 1:
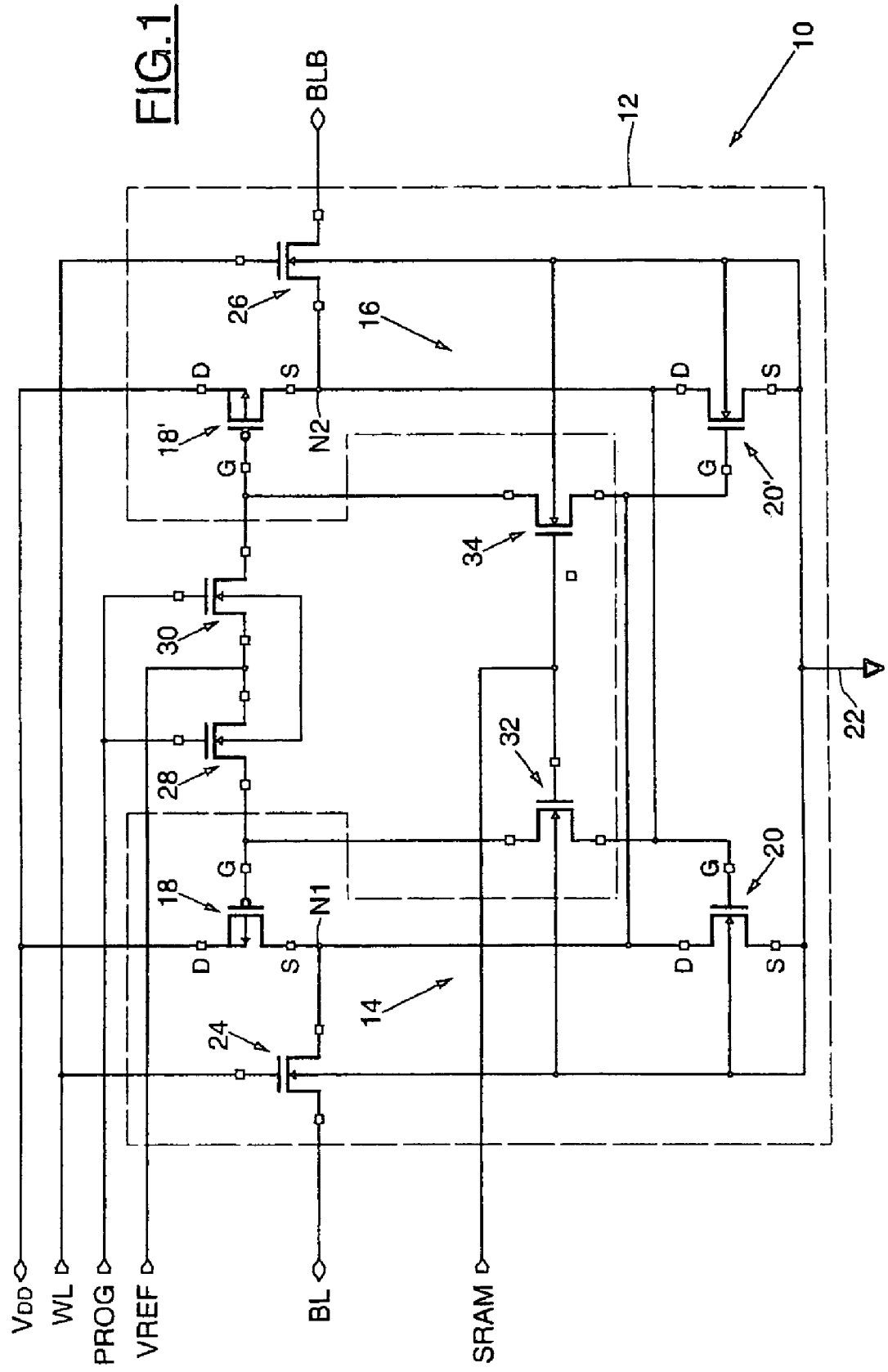
FIG. 1 is a diagram illustrating the structure of a static, nonvolatile, SRAM memory cell according to the invention.

Represented in FIG. 1 is the general structure of a nonvolatile SRAM cell, in accordance with the invention, designated by the general numerical reference 10.

As may be seen in this figure, this SRAM memory cell 10 is embodied on the basis of an SRAM memory structure point 12 (of the common 6T type) that behaves in a conventional manner. The memory cell 10 is supplemented in such a way as to make it possible to cause a degradation of one or more of the transistors involved in the constitution of the memory point 12 during the programming of the cell 10, in such a way as to cause an irreversible degradation of these transistors such that it causes a decrease in the current delivered by these transistors during reading and decrease in the threshold voltage.

As may be seen in this FIG. 1, the SRAM memory point 12 is constituted by an association of two interconnected inverters 14 and 16.

More particularly, each inverter 14 and 16 is constituted by the series association of a first PMOS load transistor, respectively 18 and 18' and of a second NMOS inverter transistor, respectively 20 and 20', linked in series between a DC voltage supply source (reference) VDD and a ground reference 22.

The transistors are arranged so that the drain D of each of the first PMOS load transistors 18 and 18' is linked to the supply source VDD and that their sources S are linked to the drains D of the second NMOS inverter transistors 20 and 20' of the same inverter and to the gate G of the second NMOS inverter transistor 20 of the other inverter.

Two additional select transistors 24 and 26, which allow access to the data nodes N1 and N2 of the SRAM memory cell which are formed at the level of the interconnection of the first and second transistors 18, 18' and 20, 20', respectively, of each inverter 14 and 16, are controlled by a word line WL for transferring a stored bit to bit lines BL and BL B.

For the programming of the SRAM cell 10, the latter is provided with programming transistors 28 and 30, constituted by NMOS transistors placed in series between the gates G of the first PMOS transistors 18, 18' of the inverters 14 and 16.

These transistors 28 and 30 are controlled by a programming control line PROG, the gate of each of these transistors being connected to this control line PROG. Moreover, the drain electrode and source electrode of these control transistors are respectively linked to a second DC voltage supply source VREF intended for setting the gate of the first transistors 18 to a level allowing a degradation of the gate oxide. Likewise, the voltage VDD provided by the first DC voltage supply source is chosen in such a way as to create a voltage VDS between the source and the drain of these first transistors 18/18' that is able to cause a degradation of the gate oxide layer of these transistors.

For the embodiment of the first transistors 18, 18' of each of the inverters 14 and 16, use is made of an MOS transistor of thin gate oxide type, also known by the name "GO1 MOS transistor". All the other transistors are thick oxide transistors so as not to be affected by the programming stress.

With such transistors, for example, in order to cause a degradation of the gate oxide layer, one uses a voltage VDD of the order of 3.3 volts and a voltage VREF of the order of 2 volts. Under these conditions, a local degradation of the gate oxide layer is created on the drain zone side of these transistors, this bringing about a drop in the threshold voltage of these transistors as well as a drop in the drain current. Such a drop in current may reach a value of 30%, depending on the reading conditions. For example, a reduction in the current of 22% is achieved for a gate voltage of 1.2 volts and a drain voltage of 1.2 volts. A reduction in current of 30% is achieved for a gate voltage of 1.2 volts and a drain voltage of 0.1 volt.

Finally, it is seen in FIG. 1 that the first and second transistors 18 and 20 of each inverter are interconnected by way of additional NMOS transistors 32 and 34 arranged so that their gate G is linked to an SRAM line for controlling the operation of the cell as an SRAM memory and that their drain and their source are respectively connected to the gate of the first and second transistors 18 and 20. Thus, a high level on this SRAM control line causes the linking of the gate G of the transistors of the inverters 14 and 16.

Figure 2:
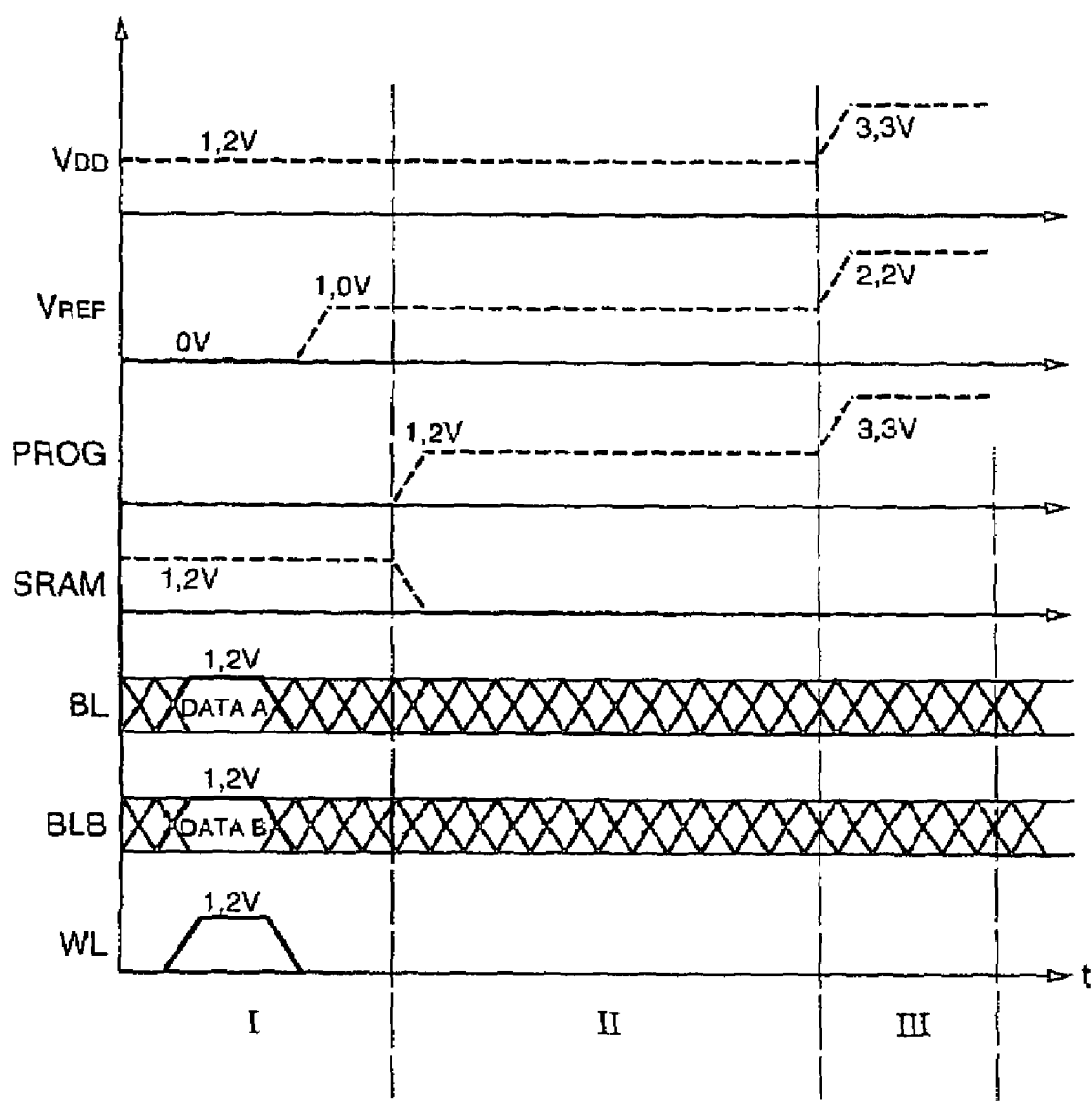
FIG. 2 shows the profile of control signals applied to the cell of FIG. 1.

The profile of the voltage levels available on the lines VDD, VREF, PROG and SRAM will now be described with reference to FIG. 2.

As indicated previously, during a cycle I of operation of the cell 10 as an SRAM memory, the voltage available on the SRAM line is set to a high level, for example of the order of 1.2 volts. The voltage levels on the lines VREF and PROG are set to a low level and the voltage VDD delivered by the first voltage supply source is set to a low level, for example 1.2 volts.

To carry out a cycle for entering a data item to be programmed, this data item "DATA" is set on the bit lines BL and BL B, that is to say (0–1) or (1–0). Next, the word line WL goes to the high state so as to set the memory point. The word line WL then goes to the low state. The bit lines BL and BL B can then change state in such a way as to write the other cells set on the same bit lines.

To cause the programming of the cell, the voltage on the SRAM line is zeroed and the voltage supplied by the PROG and VREF lines is raised to a level of the order of 1 volt, for example 1.2 volts for the voltage on the PROG line and 1 volt for the VREF line (cycle II). Finally, to proceed to the actual programming (cycle III), the voltage on the PROG line and the voltage delivered by the first supply source VDD are raised to a level of 3.3 volts. As far as the voltage VREF delivered by the second voltage supply source is concerned, the latter is for example adjusted to a level of 2.2 volts.

Such voltage levels bring about, as indicated previously, an irreversible degradation of the transistors 18 and 18', which degradation can be used for the storage of an information item for a duration of possibly up to some ten years.

On power-up, the nodes N1 and N2 are at 0 V. Depending on the data item programmed previously, one of the MOS transistors 18 or 18' provides less current than the other MOS 18' or 18. The node N2 is initialized to 1 and N1 to 0 V, or N2 to 0 V and N1 to 1, during the rise in the power supply. During reading, the bit line WL and the PROG signal are at 0. The SRAM signal must be 1 before the rise in VDD. Finally, the data item is set on the bit lines BL and BL B.

It will be noted finally that the transistors 28 and 30 of the programming means may be replaced with diodes or diode-configured transistors.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. An SRAM memory cell comprising:
   first and second inverters interconnected between first and second data nodes, each inverter comprising complementary MOS transistors connected in series between a DC voltage reference and a ground reference, and
   means for programming at least one of the complementary MOS transistors in the first/second inverter adapted for causing, after programming, an irreversible degradation of a gate oxide layer of that at least one MOS transistor.

2. The SRAM memory cell according to claim 1, wherein each inverter comprises a first PMOS transistor and a second NMOS transistor coupled in series between the voltage reference and the ground reference, the data nodes being formed respectively between the two NMOS and PMOS transistors of the inverters.

3. The SRAM memory cell according to claim 1 wherein the at least one MOS transistor which is irreversibly degraded is a thin gate oxide layer transistor.

4. The SRAM memory cell according to claim 3, wherein the oxide layer is degradable at least locally in such a way as to obtain, during the reading of the cell, a variation in the current delivered by the transistor.

5. The SRAM memory cell according to claim 1, wherein the programming means comprise, for each inverter, a programming transistor or a diode linked between a programming control line and one of the transistors of the inverter.

6. The SRAM memory cell according to claim 5, wherein the programming means comprise one of an NMOS transistor or a programming diode that selectively links the gate of the degradable transistor to a programming voltage reference delivering a voltage level able to cause, jointly with the DC voltage reference linked to the drain of the degradable transistor, a degradation in the gate oxide layer of the transistor, the programming transistor being driven by the programming control line.

7. The SRAM memory cell according to claim 1, further comprising means for causing the cell to operate as an SRAM memory after programming.

8. The SRAM memory cell according to claim 7, wherein the inverters are interconnected by way of NMOS transistors linked to a control line for instructing the cell to operate as an SRAM memory.

9. The SRAM memory cell according to claim 8, wherein a drain electrode and source electrode of each of the NMOS transistors are respectively linked to the gate of the transistors of one of the inverters.

10. An SRAM memory cell of the 6T type which includes a pair of load transistors connected to a reference voltage, the memory cell further including a programming circuit coupled to a gate of at least one of the load transistors, the programming circuit delivering a voltage to the gate of the at least one load transistor which is sufficient to cause an irreversible gate oxide degradation of the load transistor for purposes of programming the memory cell to permanently store a certain data value.

11. The SRAM memory cell of claim 10 wherein the programming circuit comprises a programming transistor having a source/drain terminal connected to a gate of the at least one load transistor and a drain/source terminal connected to a voltage reference.

12. The SRAM memory cell of claim 10 wherein the programming circuit comprises:
a first programming transistor having a source/drain terminal connected to a gate of a first one of the load transistors and a drain/source terminal connected to a voltage reference; and
a second programming transistor having a drain/source terminal connected to a gate of a second one of the load transistors and a source/drain terminal connected to the voltage reference.

13. The SRAM memory cell of claim 12 wherein the first and second programming transistors are connected in series with each other.

14. An SRAM memory cell of the 6T type including a pair of inverter transistors which are cross-coupled and a pair of load transistors, the memory cell further including a operational configuration circuit that selectively connects and disconnects a gate of a first load transistor to a gate of a first inverter transistor and selectively connects and disconnects a gate of a second load transistor to a gate of a second inverter transistor.

15. The SRAM memory cell of claim 14 wherein operational configuration circuit comprises a pair of control transistors whose gates are connected to receive a control signal, a first control transistor having its source terminal connected to a gate terminal of a first load transistor and its drain terminal connected to a gate terminal of a first inverter transistor, and a second control transistor having its drain terminal connected to a gate terminal of a second load transistor and its source terminal connected to a gate terminal of a second inverter transistor.

16. The SRAM memory cell of claim 14, further comprising a programming circuit coupled to the gate of at least one of the load transistors, the programming circuit delivering a voltage to the gate of the at least one load transistor which is sufficient to cause an irreversible gate oxide degradation for purposes of programming the memory cell to permanently store a certain data value.

17. The SRAM memory cell of claim 16 wherein the programming circuit comprises a programming transistor having a source/drain terminal connected to a gate of the at least one load transistor and a drain/source terminal connected to a voltage reference.

18. The SRAM memory cell of claim 16 wherein the programming circuit comprises:
a first programming transistor having a source/drain terminal connected to a gate of a first one of the load transistors and a drain/source terminal connected to a voltage reference; and
a second programming transistor having a drain/source terminal connected to a gate of a second one of the load transistors and a source/drain terminal connected to the voltage reference.

19. An SRAM memory cell comprising:
first and second inverters interconnected between first and second data nodes, each inverter comprising complementary MOS transistors connected in series between a DC voltage reference and a ground reference,
means for programming the memory cell by causing an irreversible degradation of a gate oxide layer of at least one of the transistors in the first/second inverter, the means for programming comprising a pair of programming MOS transistors connected in series with each other and coupled between the first and second inverters.

20. The cell of claim 19 wherein the pair of programming transistors comprises:
a first programming transistor having a source/drain terminal connected to a gate of a transistor in the first inverter and a drain/source terminal connected to a voltage reference; and
a second programming transistor having a drain/source terminal connected to a gate of a transistor in the second inverter and a source/drain terminal connected to the voltage reference.

* * * * *